United States Patent [19]

Matsuo et al.

[11] Patent Number: 4,515,755
[45] Date of Patent: May 7, 1985

[54] APPARATUS FOR PRODUCING A SILICON SINGLE CRYSTAL FROM A SILICON MELT

[75] Inventors: Shuitsu Matsuo, Atsugi; Yasuhiro Imanishi, Tokyo; Hideo Nagashima, Ebina; Masaharu Watanabe, Yokohama; Toshiro Usami, Yokohama; Hisashi Muraoka, Yokohama, all of Japan

[73] Assignees: Toshiba Ceramics Co., Ltd., Tokyo; Tokyo Shibaura Denki Kabushiki Kaisha, Kawasaki, both of Japan

[21] Appl. No.: 368,440

[22] Filed: Apr. 14, 1982

[30] Foreign Application Priority Data

| May 11, 1981 | [JP] | Japan | 56-70474 |
|---|---|---|---|
| May 11, 1981 | [JP] | Japan | 56-70475 |
| May 11, 1981 | [JP] | Japan | 56-70476 |
| May 11, 1981 | [JP] | Japan | 56-70477 |
| May 11, 1981 | [JP] | Japan | 56-70478 |
| May 11, 1981 | [JP] | Japan | 56-70479 |

[51] Int. Cl.$^3$ ............................................. C30B 15/34
[52] U.S. Cl. ................................... 422/246; 422/249; 156/608; 156/617 SP; 156/DIG. 83; 156/DIG. 99; 432/264; 432/265; 427/94
[58] Field of Search ........................ 422/246, 248, 249; 156/608, 613, 614, 617 SP, DIG. 64, DIG. 83, DIG. 88, DIG. 99; 432/264, 265; 427/94; 428/446; 423/344

[56] References Cited

U.S. PATENT DOCUMENTS

| 4,090,851 | 5/1978 | Berkman et al. | 156/608 |
|---|---|---|---|
| 4,213,940 | 7/1980 | Zerbst | 156/608 |
| 4,264,565 | 4/1981 | Inoue et al. | 423/344 |
| 4,298,629 | 11/1981 | Nozari et al. | 427/94 |
| 4,312,923 | 1/1982 | Hirai et al. | 156/613 |
| 4,346,068 | 8/1982 | Kasai et al. | 423/344 |
| 4,368,180 | 1/1983 | Inoue et al. | 423/344 |

FOREIGN PATENT DOCUMENTS

| 107833 | 8/1979 | Japan | 422/246 |
|---|---|---|---|
| 157779 | 12/1979 | Japan | 156/DIG. 83 |
| 67514 | 5/1980 | Japan | 423/344 |

OTHER PUBLICATIONS

R. D. Pehlke et al., High-Temperature Thermodynamics of the Silicon, Nitrogen, Silicon-Nitride System, Transactions of the Metallurgical Society of AIME, vol. 215, Oct. 1959, pp. 781-785.
William J. Croft et al., Editor, Review of Silicon Nitride, Review of Ceramic Technology, Feb. 1974, Issue No. 26, pp. 1-12.
Journal of Electrochemical Society, vol. 123, pp. 846-852, 1976, R. E. Chaney and C. J. Varker.
Journal of Material Science, vol. 11, pp. 593-603, 1976; K. Niihara and T. Hirai.

*Primary Examiner*—David L. Lacey
*Attorney, Agent, or Firm*—Oblon, Fisher, Spivak, McClelland & Maier

[57] ABSTRACT

An apparatus for producing silicon single crystal from melted silicon by the pull-up process using a seed crystal, wherein at least a portion of a device in contact with the melted silicon includes a layer of silicon nitride precipitated from gaseous phase and comprising 20% or above of $\beta$ phase, or comprising 80% or above of $\alpha$ phase whose crystal grains have grain diameters of 5 $\mu$m or above at a ratio of 10% or more.

11 Claims, 1 Drawing Figure

4,515,755

APPARATUS FOR PRODUCING A SILICON SINGLE CRYSTAL FROM A SILICON MELT

BACKGROUND OF THE INVENTION

This invention relates to silicon single crystal pulling devices such as crucibles or dies made of silicon nitride and a method of manufacturing the same.

As a well-known method of manufacture of silicon single crystals used as wafers for semiconductor devices, there is the so-called CZ (Czochralski) method. In this method, silicon is melted in a container (for instance a crucible), and a cylindrical single crystal of silicon is pulled up by rotating a seed crystal. The silicon melting container used in this CZ method is usually made of quartz glass. When a quartz glass container is used, however, silicon and quartz glass are reactive with each other at a temperature about equal to the melting temperature of silicon, and oxygen is trapped in the melted silicon. Therefore, about $2 \times 10^{18}$ atoms/cm$^3$ of oxygen is dissolved in the precipitated silicon. The oxygen dissolved in silicon acts as nuclei of various crystal defects to deteriorate the crystal properties of the silicon single crystal. When this single crystal silicon is processed to produce a semiconductor device, the electric properties thereof are extremely impaired.

Meanwhile, it has been proposed to use silicon nitride for melting silicon because of the fact that silicon nitride has a limited unactivity with silicon. As silicon nitride, there are porous silicon nitride obtainable by a reactive sintering process and high density silicon nitride obtainable by a hot press process However, in the reactive sintering process polyvinyl alcohol or the like is used as a binder, while in the hot press process MgO, AlN, Y$_2$O$_3$ or the like is used as a sintering promoter. This binder or promoter is inevitably introduced as impurity into the sintered silicon nitride. For this reason, if the melting of silicon and pull-up of silicon single crystal are effected using a container which is made of such silicon nitride, the impurity contained in the sintered silicon nitride is dissolved in the silicon single crystal to extremely deteriorate the crystal properties thereof.

SUMMARY OF THE INVENTION

The inventors have conducted further research and investigations on the basis of the above knowledge and have found that since silicon nitride produced by the CVD method has high purity, it is possible to obtain single crystal silicon, which has a high purity, a very low oxygen concentration of $2 \times 10^{16}$ atoms/cm$^3$ and satisfactory crystal properties, by appropriately selecting various conditions for the pull-up of silicon single crystal in the CVD (chemical vapor deposition) process.

The invention, accordingly, has an object of providing a silicon single crystal pull-up device such as a crucible or die, which is suited, for the pull-out of single crystals of silicon which have a high purity, with the oxygen concentration being less than $2 \times 10^{16}$ atoms/cm$^3$ and satisfactory crystal properties.

Another object of the invention is to provide a method of manufacturing silicon single crystal pull-up devices as mentioned above.

A first feature of the invention resides in a device made of silicon nitride for producing a single crystal of silicon from melted silicon by the pull-up process using a seed crystal, in which at least a portion in contact with melted silicon is comprised of silicon nitride precipitated from gaseous phase and containing 20% or above of $\beta$ phase.

A second feature of the invention is to provide a device made of silicon nitride for producing a single crystal of silicon from melted silicon by the pull-up process using a seed crystal, in which at least a portion in contact with melted silicon is comprised of a silicon nitride layer precipitated from gasious phase and containing 80% or above of $\alpha$ phase and also containing 10% or above of crystal grains with diameters of 5$\mu$ or above.

A third feature of the invention is to provide a device made of silicon nitride for producing a single crystal of silicon from melted silicon by the pull-up process using a seed crystal, in which at least a portion in contact with melted silicon is comprised of a silicon nitride layer with the surface roughness thereof being 400$\mu$ or below in Hmax at all portions.

A fourth feature of the invention is to provide a method of manufacturing a device used in a state of contact with melted silicon for producing a single cyrstal or ribbon-like thin plate single crystal of silicon from the melted silicon by the pull-up process, in which a crystalline silicon nitride layer is deposited by the CVD process on at least either the inner or outer surface of a base member having a predetermined shape.

DETAILED DESCRIPTION OF THE PREFERRED EMBODIMENTS

Figure 1:
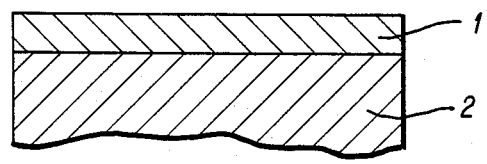
FIG. 1 is an illustration of a cross-section of the base member provided with a silicon nitride layer of the invention thereon.

In the high density crystalline silicon nitride device as a component of the pull-up device according to the invention, the content of the $\beta$ phase is set to be 20% or above because of the fact if the $\beta$ phase is reduced to be less than 20%, other crystal phases such as $\alpha$ phase are increased so that the properties of the $\beta$ phase, the reactivity of which with respect to melted silicon is extremely low compared to the $\alpha$ phase, are lost. In this, case, ready production of reaction byproducts is likely, making it difficult to obtain the pull-out of desirable silicon single crystal.

According to the invention, highly pure silicon single crystal can also be obtained with silicon nitride of not only $\beta$ phase but also of $\alpha$ phase provided the crystal grain size is comparatively large.

More particularly, according to the invention silicon single crystal of high quality as mentioned above can be obtained by using a pull-up device for producing silicon single crystal from melted silicon by the pull-up process using a seed crystal, in which part of silicon nitride to be contacted with the melted silicon contains at least 80% or above of $\alpha$ phase precipitated from gaseous phase and at least 10% of the crystal grains having lengths of no less than 5$\mu$. The content of the $\alpha$ phase (crystal phase) is set to be 80% or above, because of the fact that if the $\alpha$ phase is below 80%, the quantity of non-crystalline silicon nitride is increased to increase the reactivity with the melted silicon, thus making difficult the pull-up of silicon single crystal having the intended crystal properties. The diametrical dimension and volumetric content of the single crystal grains in the silicon nitride are respectively set to 5$\mu$ or above and 10% or above, because of the fact that if the number of crystal grains per unit area is increased, the reactivity with the melted silicon at the grain interface increases. For instance, even with the α phase system the edges of crystal grains are erroded and rounded although to less extent compared with the non-crystalline system. For this reason, it is difficult to obtain silicon single crystal having the intended crystal properties and purity by the pull-up process.

The silicon nitride as the material of the container according to the invention is manufactured by the CVD method, which permits ready refinement of raw material gas and also with which super-high purity can be achieved. Generally, with the CVD process the nature of the product material can be changed by finely controlling the conditions for manufacture, and the characteristics of the product silicon nitride can be varied by varying the deposition temperature and the composition of the raw material gas. More particularly, when the deposition temperature is within a range between 800° and 1,000° C., the product is non-crystalline silicon nitride, permitting no diffraction image to be obtained by X-ray diffraction. On the other hand, when the deposition temperature is in a range between 1,050° and 1,450° C., dense crystalline silicon nitride can be obtained. If the deposition temperature exceeds 1,450° C., many crystal grains precipitated on a base member from gasious phase grow in the form of vertical needles on the surface of the base member, and those which grow along the surface of the base member and tied to one another are reduced in number. It has been found that a loose structure, i.e., porous silicon nitride, results. For the above reasons, the deposition temperature as one of the conditions of the CVD process of depositing silicon nitride is set to be between 1,050° and 1,450° C., whereby silicon nitride of satisfactory properties as described above can be obtained.

According to the invention, what results from deposit on of a predetermined thickness of silicon nitride on at least either one of the inner and outer side of a base member having a predetermined shape by the CVD process may be directly used as the high density silicon nitride container, die or the like for pulling up silicon single crystal. Alternatively, solely the deposited silicon nitride ($Si_3N_4$), obtained by removing the base member either thermally or through a chemical reaction, may be used.

Examples of the material of the base member reference character 1 of FIG. 1 are carbon, silicon, silicon carbide and silicon nitride. Where a silicon nitride sintered base member is used, it is desirable that the porosity is 10 to 40%, preferably 20 to 30%, the Fe content is 250 ppm or below, preferably 150 ppm, and the Cu content is 50 ppm or below, preferably 10 ppm. If the Fe and Cu contents are above the aforementioned limits, the purity of silicon single crystal is reduced at the time of the pull-up due to these impurities. Also, polycrystallization is likely. The reason for setting the porosity of the sintered base member to be between 10 and 40% is that if it is below 10% the silicon nitride film precipitated from gaseous phase is in less close contact with the sintered body so that the peel-off of the silicon nitride film is likely, while if it is above 40% a rough silicon nitride film results from precipitation from gaseous phase so that pinholes are liable to be generated.

Where a silicon nitride base member is used, a highly durable container with the crystalline silicon nitride film coating which is less prone to cracks caused by thermal shocks, can be obtained since the coefficients of thermal expansion of the base member and deposited crystalline silicon nitride film substantially coincide with each other.

Where a carbon base member is used, it is desirable that the specific gravity of carbon based on the n-butylalcohol process is 1.30 to 1.60 g/cc and that the air permeability thereof is $10^{-6}$ $cm^2$/sec. or below. The range of the specific gravity of the carbon base member by the n-butylalcohol process is set as above without definite ground, but if this range is departed, inferior spalling-resistivity of the deposited film results. The air permeability of the carbon base member is set to the aforementioned range because of the fact that if it exceeds $10^{-6}$ $cm^2$/sec., the uniformity of the base member is deteriorated, and the number of open pores on the surface is increased. Consequently, projections of the deposited silicon nitride that fill the open pores at the interface with the base member are increased and remain as a source of thermal strain, giving rise to thermal cracks.

After the eilicon nitride film reference character 2 of FIG. 1 is deposited on the carbon base member, either the carbon base member may be removed to obtain a structure consisting of the sole silicon nitride, or the structure including the carbon base member without being removed may be directly used, as mentioned earlier.

As the silicon crystal base member, either a polycrystalline silicon base member or a single crystalline silicon base member may be used. The polycrystalline silicon base member may be produced by molding silicon powder into a desired shape by a suitable molding method such as injection, rubber press or ordinary press and sintering the molding in an inert gas atmosphere at a temperature of 1,100° to 1,350° C. The silicon power used may be what is obtained by pulverizing semiconductor grade polycrystalline silicon or rejected semiconductor silicon single crystals or what is obtained by pulverizing byproducts in the silicon industry or in the manufacture of semiconductor grade polycrystalline silicon.

As for the gas from which to obtain the precipitation of the deposited silicon nitride layer, a halogen compound of silicon or silane is used as a source of silicon and $NH_3$, $N_2$ or the like is used as a source of nitrogen. As the gas for suitably diluting these gases for transporting them, i.e., carrier gas, $H_2$ or $N_2$ gas or a mixture gas thereof may be used.

The thickness of the silicon nitride film according to the invention is desirably 5μ or above. The reason for this is that if the thickness is below 5μ, generation of local pinholes is liable, and such pinholes will cause intrusion of melted silicon into the silicon nitride body at the time of the pull-up of the silicon single crystal, thus reducing the purity of the silicon.

As the purity of the silicon nitride film thus formed, it is desirable that the boron content is 3 ppm or below, the aluminum content is 5 ppm or below and the iron content is 10 ppm or below.

The heat-resisting base member on which the silicon nitride film is deposited need not be removed if there is no problem. However, if it is necessary to remove the base member, it may be selectively removed by making use of the difference in the physical or chemical properties between it and the deposited silicon nitride film.

For example, in case of the carbon base member, it is possible to obtain ready removal of carbon through oxidation. In the case of the silicon crystal base member, it may be removed by various means such as by heating with HCl or $Cl_2$ gas or melting it with the temperature thereof increased to above 1,417° C., the melting point of silicon, by increasing the temperature of high frequency heating in the CVD device after the deposition of the silicon nitride layer is ended. Particularly, by these methods the silicon crystal base member may be removed without need of cooling down the deposited polycrystalline silicon nitride to the normal temperature but substantially at the same temperature as at the time of the deposition. Thus it is possible to avoid generation of local thermal stress produced in the silicon nitride layer during cooling down to the normal temperature due to the difference in the coefficient of thermal expansion between the silicon crystal base member and silicon nitride, thus permitting manufacture of a tool solely consisting of silicon nitride of satisfactory spalling-resistivity.

Further, aside from directly depositing a silicon nitride layer on the base member as described above, it is also possible to deposit a thin film of silicon prior to the deposition of the silicon nitride layer and remove the deposited silicon film with an etching gas, these steps being carried out without any cooling step involved but with the temperature held in a range between 700° and 1,600° C. In this case, the thickness of the silicon thin film is desirably set to 10 to 300$\mu$. The reason for this is that if the thickness of the silicon thin film is less than 10$\mu$, generation of pinholes is prone, causing the silicon nitride layer deposited on the silicon layer to be in contact with the base member thereunder through the pinholes. Therefore, not only reliable separation of the silicon nitride layer from the base member becomes difficult but also reduction of the purity of the layer is liable. Although the silicon thin film may have a thickness in excess of 300$\mu$, in this case a long time is required for its removal, which is undesireable from the standpoint of the productivity.

The base member may be repeatedly used, if the base member is not severly etched when removing the silicon thin film to separate the silicon nitride layer.

The reason for holding the temperature in the series of steps of depositing the silicon thin film, depositing the silicon nitride layer and removing the silicon thin film in the range between 700° and 1,600° C. is that if the temperature is below 700° C., not only the tendency of generation of thermal stress due to the coefficient of thermal expansion between the base member and silicon nitride film is increased but also the removal of the silicon thin film with the etching gas becomes difficult. On the other hand, if the temperature exceeds 1,600° C., the nature of the silicon nitride layer is adversely affected. A more preferred temperature range is 1,200° to 1,450° C.

The inventors have further found that the surface roughness of the silicon nitride film in contact with the melted silicon is related to the degree of crystallization of silicon being pulled up. More particularly, if the surface roughness of the silicon nitride film is increased, the area of silicon nitride in contact with the melted silicon is increased to increase the reactivity of silicon nitride and melted silicon with respect to each other, thus increasing the nitrogen concentration in the silicon crystal being pulled up. It has been found that secondary precipitation of silicon nitride is likely and the secondary silicon nitride thus formed floats on the surface of the melted silicon and trapped into the silicon crystal being pulled out to constitute nuclei of crystal defects, thus resulting in polycrystalline silicon being pulled out. Thus, it has been found that the surface roughness of the contact surface of the silicon nitride film in contact with the melted silicon is 400$\mu$ or below, preferably 25$\mu$ or below in Hmax, in any portion. The surface roughness in this invention is based on JIS B 0601.

The surface roughness of the silicon nitride film is adjusted to be in the aforementioned range by means of mechanical processing or etching or by suitably selecting the conditions of deposition of the silicon nitride film such as deposition speed, deposition temperature, deposition process, etc.

The mechanical processing may be polishing with diamond. The etching, process may be physical etching using sand blasting or chemical etching using HCl gas, $Cl_2$ gas, $HF-HNO_3$, and etc.

As for the depositing conditions, it is possible to reduce the surface roughness to cause precipitation from gas containing silicon and gas containing nitrogen at a temperature of 1,100° to 1,500° C. or to set a low deposition speed of 1 to 300$\mu$/hour, preferably 1 to 40$\mu$/hour.

Further, the orientation of the opening of the silicon single crystal pull-up device may be suitably selected when carrying out the deposition of silicon nitride to prevent intrusion of impurities through the opening so as to smooth the surface roughness of the silicon nitride film. In other words, directing the opening in the horizontal direction or downwards or in a direction making a suitable angle, for instance 50°, from the upward direction so that no impurities substantially fall into the inside, has an effect of preventing the increase of the surface roughness.

Further, the surface roughness of the silicon nitride surface may be controlled by making smooth the outer or inner surface of the heat-resisting base member, depositing the silicon nitride film on the smooth outer or inner surface and then separating the heat-resisting base member and deposited silicon nitride film such that the surface of the deposited silicon nitride film having been in contact with the heat-resisting base member is submitted to in contact with the melted silicon. By so doing, it is possible to obtain the contact surface of the silicon nitride film as a smooth surface conforming to the smoothness of the outer surface of the base member. In this case, it has been found that the surface of the deposited silicon nitride film in contact with the heat-resistant base member is constituted by crystal grains of a very small grain diameter compared to the crystal grains of the outer side due to suppressed growth of crystal grains.

Now, examples of the invention will be given.

EXAMPLE 1

High purity silicon powder was molded with polyvinyl alcohol used as binder. The molding was then subjected to a nitrifying process in a nitrogen atmosphere at 1,400° C. for 5 hours to produce a porous crucible-shaped silicon nitride sintered body (base member). This base member contained 200 ppm of Fe and 40 ppm of Cu as impurities. Then, the base member was put into a deposition furnace, and a crystalline silicon nitride film with a thickness of 80 to 130$\mu$ and mainly consisting of the $\mu$ phase was deposited on the base member by the CVD process with 270 cc/min of $SiCl_4$ gas, 0.1 cc/min of $TiCl_4$ gas, 2,000 cc/min of $H_2$ gas and 80 cc/min of $NH_3$ gas supplied to the furnace and under pressure and temperature conditions of 200 Torr and 1,400° C., thus obtaining a silicon single crystal pull-up crucible.

REFERENCE EXAMPLE 1

Crystalline silicon nitride films with thicknesses of 80 to 130μ and mainly consisting of the α phase having a crystal grain of less than 20 μm are deposited on the base member of the above Example 1 in a deposition furnace under the same conditions as in the Example 1 except for that the TiCl₄ gas is not used, thus obtaining silicon single crystal pull-up crucibles.

The crucibles obtained in the Example 1 and Reference Example 1 and also a crucible consisting of reactive sintered silicon nitride (Comparison example 1), a crucible consisting of hot press silicon nitride (Comparison example 2) and a quartz galss crucible (Comparison example 3) were used to melt and pull up silicon by pulling a seed crystal from the surface of the melted silicon while rotating the seed crystal. The oxygen content and crystal state of the resultant cylindrical silicon products are as in Table 1 below. In the Table, the character of silicon nitride film is listed in the columns for the Example 1 and Reference Example 1 and the character of silicon nitride is listed in the columns of the Comparison examples 1 and 2.

case of the crucible having the silicon nitride film containing much $\beta$ phase (Example 1) compared to the case with the crucible having the silicon nitride film containing much $\alpha$ phase (Reference example 1). This is thought to be due to the fact that the $\beta$ phase silicon nitride is superior in stability at high temperatures and has extremely lower reactivity with respect to the melted silicon. Also, with the silicon single crystal obtained with the crucible of Example 1, the oxygen content is $2 \times 10^{16}$ atoms/cm³ or less, which is far lower than the oxygen of $1 \times 10^{18}$ atoms/cm³ of the silicon single crystal obtained with the quartz glass crucible (Comparison example 3).

Similar pull-up tests were conducted by using crucibles obtained by varying the $\alpha$ and $\beta$ phase proportions in the crystalline silicon nitride film based on the CVD process, and it was found that when the $\beta$ phase is contained by 20% or above, preferably 30% or above, substantially no reaction product with the melted silicon was produced, and single crystal could be readily obtained by the pull-up process.

EXAMPLE 2

High purity silicon powder was molded with polyvinyl alcohol used as binder. Then, the molding was sub-

TABLE 1

| | Example | Reference example | Comparison 1 | Comparison 2 | Comparison 3 |
|---|---|---|---|---|---|
| Crucible material | Crystalline silicon nitride film with 55% of β phase and 45% of α phase on base member | Crystalline silicon nitride film with 95% of α phase and 5% β phase on base member | Reactive sintered silicon nitride alone | Hot press silicon nitride alone | Quartz glass |
| Porosity (%) | 0.5 or below | 0.5 or below | 25 | 1.5 or below | — |
| Fe content (ppm) | 25 | 26 | 200 | 180 | — |
| Cu content (ppm) | 5 | 5 | 40 | 35 | — |
| Oxygen concentration (atoms/cm³) | $2 \times 10^{16}$ or below | $2 \times 10^{16}$ or below | — | — | $1 \times 10^{18}$ |
| Character of silicon after pull-up | Single crystal | Single crystal | Polycrystalline | Polycrystalline | Single crystal |
| Remarks | Very less reaction products | Slightly increased reaction products | Many reaction products | Many reaction products | Less reaction products |

As is seen from the Table above, when the crucible consisting of the reactive sintered silicon nitride (Comparison example 1) and the crucible consisting of the hot press silicon nitride (Comparison example 2) were used, the pulled-up silicon was not single crystal silicon but polycrystalline. This is because of the fact that a great quantity of foreign matter mainly consisting of needle-like β phase silicon nitride which is presumably a product of reaction between the melted silicon and silicon nitride is floated up and trapped in the silicon being pulled up. On the other hand, when the crucible with the silicon nitride film produced by the CVD process deposited on the base member was used, silicon single crystal could be obtained irrespective of the proportions of the α and β phases in the silicon nitride film. However, silicon single crystal could be obtained far more readily with less reaction product produced in jected to a nitrifying treatment in a nitrogen atmosphere at 1,400° C. for 5 hours to obtain a porous crucible silicon nitride sintered body (base member). Then, such base members were used to produce four different silicon single crystal pull-up crucibles by deposition of silicon nitride films with thicknesses ranging from 100 to 200μ on these base members in a deposition furnace by the CVD process with 260 cc/min of SiCl₄ gas, 2,000 cc/min of H₂ gas and 80 cc/min of NH₃ gas supplied under a pressure of 20 Torr and at temperatures listed in the Table 2 below.

The characters of the silicon nitride films of the individual crucibles thus obtained were examined by the X-ray diffraction. Also, the crystal character and oxygen content of cylindrical silicon obtained by the pull-up process using each of these crucibles were determined. Table 2 below shows the results.

TABLE 2

| Crucible No. | Deposition temperature | Crystal character of silicon nitride film | Character of silicon after pull-up | Oxygen concentration (atoms/cm³) | Remarks |
|---|---|---|---|---|---|
| 1 | 800° C. | Amorphous | Polycrystalline | — | Many reaction |

TABLE 2-continued

| Crucible No. | Deposition temperature | Crystal character of silicon nitride film | Character of silicon after pull-up | Oxygen concentration (atoms/cm$^3$) | Remarks |
|---|---|---|---|---|---|
| 2 | 1,000° C. | Partly in α phase | Polycrystalline | — | Many reaction products |
| 3 | 1,300° C. | Containing 80% or above of α phase and 20% or above of single crystal grain with diameters of 5μ or above | Single crystal | 2 × 10$^{16}$ | Less reaction products |
| 4 | 1,600° C. | Porous body of comparatively large crystal grains with 80% or above of α phase | Polycrystalline | — | Many reaction products wetted by silicon |

As is seen from the above Table, with the crucible No. 1 having an amorphous silicon nitride film and the crucible No. 2 which did not contain single crystal grains with diameters in excess of 5μ although slightly containing o phase as recognized by X-ray diffraction, single crystal of silicon could not be obtained because foreign matter presumably consisting of a reaction product (nitride) of reaction between the melted silicon and silicon nitride film was floated on the surface of the melted silicon and trapped into the silicon being pulled up. With the crucible No. 4 which had a porous silicon nitride film with a porosity of about 10% although being an aggregate of comparatively large crystal grains including column-like crystals, melted silicon penetrated the silicon nitride film to reach the base member to result in generation of foreign matter due to reaction with the base member, so that single crystal of silicon could not be obtained. In contrast, with the crucible according to the invention, having a high density silicon nitride film containing 80% or above of the α phase and 10% or above of single crystal grains with grain diameters 5μ or above, little reaction product was produced by reaction with the melted silicon, and single crystal of silicon could be obtained. Also, the oxygen content in the silicon single crystal was 2×10$^{16}$ atoms/cm$^3$, lower than the oxygen content of about 1×10$^{18}$ atoms/cm$^3$ in the silicon single crystal obtained with the prior art quartz glass crucible.

EXAMPLE 3

Semiconductor polycrystalline silicon was pulverized, and the resultant silicon powder was molded with polyvinyl alcohol used as binder. The molding thus obtained was then subjected to a nitrifying treatment in a nitrogen atmosphere at 1,400° C. for 5 hours (crucibles No. 5 and No. 6). These crucibles were then subjected to a purifying treatment in Cl$_2$ gas at 1,400° C. (crucibles No. 7, No. 8 and No. 9). Table 3 below shows the purity and porosity of these five different silicon nitride sintered bodies (base members). From these base members, five different silicon single crystal pull-up crucibles were produced by introducing them into a deposition furnace and depositing a silicon nitride film with a thickness of 80 to 130μ over the entire surface of each base member by the CVD process with 260 cc/min of SiCl$_4$ gas, 2,000 cc/min of H$_2$ gas and 80 cc/min of NH$_3$ gas supplied under a pressure of 20 Torr and at a temperature of 1,380° C.

Using each of these crucibles, silicon was melted and single crystal silicon was pulled up from the surface of the melted silicon while rotating a seed crystal. The oxygen concentration and crystal state of cylindrical silicon single crystals thus obtained are also listed in Table 3.

TABLE 3

| Crucible No. | Character of silicon nitride sintered body | | | Silicon crystal pulled-up | Oxygen concentration in silicon crystal (atoms/cm$^3$) | Remarks |
|---|---|---|---|---|---|---|
| | Fe content (ppm) | Cu content (ppm) | Porosity (%) | | | |
| 5 | 1,000 | 250 | 25 | Polycrystalline | — | Many impurities polycrystalline |
| 6 | 500 | 40 | 25 | Polycrystalline | — | Many impurities polycrystalline |
| 7 | 210 | 20 | 25 | Single crystal | 2 × 10$^{16}$ | |
| 8 | 200 | 25 | 9 | — | — | Silicon nitride film was peeled off |
| 9 | 240 | 25 | 13 | Single crystal | 2 × 10$^{16}$ | |

As is seen from the Table above, when the crucibles No. 5 and No. 6 having the base member consisting of a silicon nitride sintered body with the content of at least either Fe or Cu being higher than the range according to the invention (Fe: being 250 ppm or below and Cu: being 50 ppm or below) was used, much impurities were introduced into the melted silicon due to the impurities dispersed in the silicon nitride film deposited on the base member, and the silicon obtained was not single crystal silicon but polycrystalline. When the crucible No. 8 using as the base member a silicon nitride sintered body with the Fe and Cu contents less than the ranges according to the invention but with the porosity below the specified values (with the lower limit being 10%), was used, peel-off of the silicon nitride film occurred during the pull-up of silicon, thus making it difficult to obtain the intended pull-up of silicon single crystal. In contrast, when the crucibles No. 7 and No. 9 according to the invention, with the Fe and Cu contents being below the specified values and the porosity being within the range of 10 to 40%, the silicon nitride film deposited on the base member was not peeled off, and the given high purity can be maintained. Thus, it was possible to suppress intrusion of impurities into the melted silicon and obtain high quality silicon single crystal by the pull-up process. The oyxgen content in the silicon single crystals obtained by using the crucibles No. 7 and No. 9 was $2 \times 10^{16}$ atoms/cm$^3$.

EXAMPLE 4

A condensate of furfuryl alcohol and coke particles were mixed in various proportions, and the mixtures were used to prepare five different silicon nitride deposition base members. Table 4 below lists the composition and properties of the base members.

Then, silicon nitride films with a thickness of 280μ were deposited on the base members by setting the base members in a deposition furnace and supplying 260 cc/min of SiCl$_4$, 80 cc/min of NH$_3$ gas and 2,000 cc/min of H$_2$ gas under a pressure of 20 Torr and at a temperature of 1,380° C.

On these test pieces a sudden heating-sudden cooling test by holding them at 420° C. for 5 minutes and then charging them into water and also a sudden heating-sudden cooling test of holding flat plates consisting of the sole silicon nitride obtained by removing the carbon base member and then charging them into water were conducted to obtain results as shown in the Table 4.

REFERENCE EXAMPLE 2

A commercially available electrode carbon material was prepared as the carbon base member for deposition. It has properties as shown in Table. 4. Its bulk density was 1.7 g/cc, and its coefficient of thermal expansion was $3.0 \times 10^{-6}$/°C. Silicon nitride films are deposited on this base member under the same condition as in the above Example 4, and the same sudden heating sudden cooling tests were conducted on the resultant test pieces. The results are also shown in Table 4.

TABLE 4

| | Base member | | Properties of base member | | | Spalling-resistivity | |
| | | | | | | Composite without removal | Silicon |
| Experiment No. | Furfryl alcohol | Coke particles | Specific gravity | Pore factor | Air permeability | of carbon base member | nitride alone |
| --- | --- | --- | --- | --- | --- | --- | --- |
| 1 | 100% | 0% | 1.33 g/cc | 0.3% | $10^{-13}$ cm$^2$/sec | 10 | 16 |
| 2 | 95% | 5% | 1.40 g/cc | 0.5% | $10^{-12}$ cm$^2$/sec | 11 | 15 |
| 3 | 90% | 10% | 1.52 g/cc | 1.9% | $10^{-7}$ cm$^2$/sec | 8 | 13 |
| 4 | 80% | 20% | 1.65 g/cc | 5.5% | $10^{-5}$ cm$^2$/sec | 2 | 5 |
| 5 | 50% | 50% | 1.80 g/cc | 13.0% | $10^{-2}$ cm$^2$/sec | 3 | 3 |
| Reference | — | | 2.10 g/cc | 19% | $10^2$ cm$^2$/sec | 2 | 3 |

*Number of test cycles until generation of cracks

As is seen from Table 4, with carbon base members with specific gravities of 1.6 g/cc or below and low air permeabilities, the spalling-resistivity is excellent with the composite system and also with the sole silicon nitride.

EXAMPLE 5

Silicon single crystal or silicon polycrystal was pulverized with a carbonated tungsten mortar to prepare silicon powder with a grain diameter less than 150 meshes. Then, about 3% by weight of 0.5% solution of polyvinyl alcohol was added to the silicon powder. The mixture thus obtained was used to produce a crucible-like molding with a density of 55 to 65%, an outer diameter of 80 mm, an inner diameter of 72 mm and a height of 150 mm by the rubber press process. Then, the molding was sintered in an argon atmosphere at 1,200° C. for about 3 hours to obtain a silicon polycrystalline base member. At the time of the sintering, this base member was contracted by about 6.0% so that the density was about 80%, the outer diameter was 75 mm, the inner diameter was 68 mm, and the height was 142 mm.

Then, the aforementioned crucible-like silicon polycrystalline base member was set on a support member of a CVD reaction apparatus such that the opening of the base member faced a gas inlet. Then, the base member was exhausted with a rotary pump by rotating the support member at a speed of 5 to 6 rotations per minute. Subsequently, H$_2$ gas was supplied at a rate of 2 l/min from the inlet while continuing the exhausting. At the same time, a carbon susceptor provided in the device is caused to generate heat by energizing a high frequency coil, for heating the silicon polycrystalline crystal base member with the heat of radiation until the surface thereof reaches 1,360° C. Then, deposition of silicon nitride on the base member was carried out for about 15 hours by supplying 270 cc/min of SiCl$_4$, 60 to 90 cc/min of NH$_3$ and 1,000 cc/min of H$_2$ gas toward the inner surface of the base member while maintaining the total gas pressure inside the device to be 25 to 30 Torr. At this time, a polycrystalline silicon nitride layer with a thickness of about 1.2 mm is deposited on the inner surface of a the crucible-like silicon polycrystalline base member. Afterwards, the supply of the SiCl$_4$ gas, NH$_3$ gas and H$_2$ gas is stopped, and the temperature inside the device is lowered to about 850° C., and the silicon polycrystalline base member was removed by dispersion by supplying HCl gas to obtain a crucible consisting of the sole polycrystalline silicon nitride.

The silicon nitride crucible has a high purity and a high density. Also, the generation of local thermal stress was less, and the spalling-resistivity was excellent. This crucible was used to melt silicon and pull up a seed crystal from the surface of the melted silicon while rotating it, whereby a cylindrical silicon single crystal with a very low oxygen content of $2 \times 10^{16}$ atoms/cm$^3$ was obtained.

EXAMPLE 6

Silicon powder was pulverized in an oscillating mill to obtain fine powder of a 325 mech pass or below. The fine powder was then washed several times with diluted hydrochloric acid several times to remove iron, alkali and others, and then the resultant fine powder was sufficiently washed with deionized water. The purified silicon fine powder thus obtained was then added to the deionized water containing NH$_4$OH as deflocculating agent, and the resultant system was kneaded to prepare a slip with a pH of 8 to 9. The slip was then cast into a crucible-like gypsum mold to produce a round bottom crucible-like molding with a wall thickness of 3 to 7 mm, an outer diameter of 60 mm and a depth of 130 mm. The molding thus obtained had a density of 1.65 g/cc (corresponding to a silicon density of 70%) after natural drying. Thereafter, the molding was sintered in an argon atmosphere at 1,200° C. for about 2 hours to obtain a crucible-like silicon polycrystalline base member with a density of about 85%.

Then, like the previous Example 5, the aforementioned crucible-like silicon polycrystalline base member was set on a support member of a CVD reacting device such that its round bottom portion faces the inlet, then the temperature of the base member surface was elevated to 1,330° C. by energizing a high frequency coil, and then deposition of silicon nitride was carried out for about 20 hours by supplying 300 cc/min of $SiCl_4$ and 85 to 95 cc/min of $NH_3$ through adjustment of corresponding needle valves and adjusting the flow of $H_2$ gas such that the total gas pressure is 20 to 30 Torr. At this time, a polycrystalline silicon nitride layer with a thickness of 1.8 mm was deposited on the outer surface of the crucible-like silicon polycrystalline base member. Thereafter, the supply of $SiCl_4$ gas, $NH_3$ gas and $H_2$ gas was stopped, and the temperature inside the device was reduced down to 800° C. Then, the silicon polycrystalline base member was removed by supplying HCl to obtain a crucible consisting of sole polycrystalline silicon nitride and having a wall thickness of about 1.8 mm, an outer diameter of 60 mm and a height of 130 mm.

The silicon nitride crucible thus obtained has a very high purity and a high density. Also, little local thermal stress was generated, and the spalling-resistivity was excellent. This crucible was used to melt silicon and pull up a seed crystal from the surface of the melted silicon while rotating it, whereby a cylindrical single crystal with a very low oxygen content of $2 \times 10^{16}$ atoms/cm$^3$ could be obtained.

EXAMPLE 7

A plate-like silicon crystal base member with a width of 50 mm, a length of 85 mm and a thickness of 1 mm is set upright in a CVD reacting device by inserting a 50-mm side of the base member in groove (about 2 mm deep) in a support member. Then, the device is exhausted while rotating the support member at a rate of 5 to 6 rotations per minutes, and then $H_2$ gas is supplied at a rate of 2 l/min from the inlet while continuing exhausting. At the same time, the high frequency coil is energized to cause heat generation of a carbon heat generator in the device to heat the silicon single crystal with the heat of radiation until the temperature of the surface becomes 1,370° C. Then, deposition of silicon nitride was effected for about 8 hours by supplying 230 cc/min of $SiCl_4$, 75 cc/min of $NH_3$ and $H_2$ gas such that the total gas pressure is 25 to 35 Torr through adjustment of the individual needle valves. At this time, a polycrystalline silicon nitride layer with a thickness of 0.8 mm was deposited on the entire surface of the base member except for the portion thereof embedded in the support member. Subsequently, the system was taken out and set in a separate furnace (at a temperature of 900° C.), and then HCl gas is supplied to the furnace to remove the exposed portion of the silicon single crystal base member not covered by the silicon nitride layer, thus obtaining a hollow silicon nitride body with a width of 1 mm and a length of 50 mm and having an opening. Thereafter, the silicon nitride body was cut along planes parallel to the plane of the opening to obtain frame-like dies with a thickness of 0.8 mm.

The crystalline silicon nitride die thus obtained was placed on the same silicon nitride crucible as that used in the previous Example 5, and melted silicon within the crucible was pulled through a hollow section of the die by using a ribbon-like seed crystal. In this case, no clogging due to reaction product to reaction between the die and melted silicon was resulted even for a period of use beyond 12 hours. The same die could be used for six times for pulling up ribbon-like silicon crystals with a thickness of 1.3 mm and a width of 50 mm and having a very low oxygen content of $2 \times 10^{16}$ atoms cm$^3$ or below.

EXAMPLE 8

Semiconductor polysilicon was pulverized, and the silicon powder thus obtained was molded with polyvinyl alcohol used as binder. The molding was then subjected to a nitrifying treatment in a nitrogen atmosphere at 1,400° C. for 5 hours and then subjected to a purifying treatment in a $Cl_2$ gas at 1,400° C., thus obtaining a base member. Such base members ware used to produce silicon single crystal pull-up crucibles by introducing these base members into a deposition furnace and depositing a silicon nitride film with a thickness of 80 to 130$\mu$ on the entire base member surface by the CVD process by supplying 260 cc/min in of $SiCl_4$, 2,000 cc/min of $H_2$ gas and 80 cc/min of $NH_3$ gas under a pressure of 20 Torr and at a temperature of 1,380° C.

Then, the B, Al and Fe contents in the silicon nitride film of each crucible were measured. Further, each crucible was used to melt silicon and produce silicon single crystal by pulling up a seed crystal from the surface of the melted silicon while rotating it. The results are shown in Table 5.

TABLE 5

| Crucible No. | B content | Al content | Fe content | Remarks |
|---|---|---|---|---|
| 10 | 5 | 2 | 1 | Polycrystalline |
| 11 | 3 | 2 | 1 | Single crystal |
| 12 | 1 | 3 | 5 | Single crystal |
| 13 | 2 | 5 | 2 | Single crystal |
| 14 | 1 | 7 | 4 | Polycrystalline |
| 15 | 1 | 6 | 7 | Polycrystalline |
| 16 | 2 | 2 | 10 | Single crystal |
| 17 | 4 | 5 | 8 | Polycrystalline |
| 18 | 1 | 5 | 10 | Single crystal |
| 19 | 1 | 4 | 15 | Polycrystalline |

(Relation between silicon single crystal and impurity content (ppm))

The results show that the B content is preferably 3 ppm or below, the Al content is preferably 5 ppm or below, and the Fe content is preferably 10 ppm or below.

EXAMPLE 9

Seven crucible-like base members consisting of carbon or silicon carbide with the coefficient of thermal expansion as listed in Table 6 below were put into reaction furnace, and silicon thin films of the film thicknesses as shown in the same Table were deposited on the inner surface of these base members by the CVD process with 40 cc/min of $SiCl_4$ gas and 2,000 cc/min of $H_2$ gas supplied at a temperature of 1,200° C. Then, a silicon nitride layer with a thickness of 500$\mu$ was deposited on the silicon film formed on the inner surface of each base member by increasing the temperature of the reaction furnace and supplying 240 cc/min of SiCl$_4$, 80 cc/min of NH$_3$ gas and 2,000 cc/min of H$_2$ gas. Then, the supply of gases was stopped, and the silicon film between the base member and silicon nitride layer was removed by introducing 500 cc/min of HCl gas and 500 cc/min of H$_2$ gas while holding a temperature of 1,350° C. or below. Thereafter, the reaction furnace was cooled down, and the freed silicon nitride layer on the inner surface of the crucible-like base member was taken out. In this way, seven crucibles consisting of different kinds of silicon nitride were obtained.

On the individual crucibles thus obtained, a sudden heating-sudden cooling test of increasing the crucible temperature from room temperature to 1,000° C. in 10 seconds, then holding that temperature for 5 minutes and causing natural cool-down to room temperature was carried out to obtain the number of test cycles until cracks were generated in the crucible, thus determining the spalling-resistivity. The results were also shown in the Table 6. The comparison crucible shown in the Table is a crucible consisting of sole silicon nitride obtained by the prior art method of depositing a silicon nitride layer with a thickness of 500 μm on the inner surface of the crucible-like carbon base member under the same conditions as mentioned above, then taking the system out of the reaction furnace and cooling it down to room temperature and then removing the carbon base member through oxidation in an oxidizing atmosphere at a temperature of 500° to 1,000° C.

small thickness of 9, cracks were generated in 7 cycles of sudden heating and sudden cooling although the spalling-resistivity was slightly superior to that obtained by the prior art method. This is thought to be due to generation of thermal stress in the silicon nitride layer with rough surface caused by pinholes or porosity of the base member.

EXAMPLE 10

Silicon single crystal pull-up crucibles were produced in the manner as described in the Example 9, and their inner surface was machined using diamond powder to different surface states as shown in Table 7. These crucibles were used to conduct silicon pull-up tests, and it was found that there is a relation between the surface roughness of the crucible and the degree of crystallization of silicon.

TABLE 7

| Crucible No. | Hmax | Precipitation | Silicon crystal |
|---|---|---|---|
| 20 | 0.5 | Less | Single crystal |
| 21 | 1 | Less | Single crystal |
| 22 | 20 | Less | Single crystal |
| 23 | 100 | Less | Single crystal |
| 24 | 250 | Slightly great | Single crystal |
| 25 | 430 | Great | Polycrystalline |
| 26 | 540 | Very great | Polycrystalline |

It is thought that coarser surface promotes the reactivity between the silicon nitride and melted silicon to increase the amount of dissolved nitrogen, and with

TABLE 6

| | Base member | | | | Temperature | |
|---|---|---|---|---|---|---|
| Experiment No. | Material | Coefficient of thermal expansion (10$^{-6}$/°C.) | Thickness of silicon (μm) | Thickness of silicon nitride layer (μm) | of removal of silicon thin film (°C.) | Spalling-resistivity (number of times) |
| 1 | Carbon | 4.0 | 150 | 500 | 1,350 | 25 |
| 2 | Carbon | 2.6 | 100 | 500 | 1,350 | 26 |
| 3 | Silicon carbide sintered body | 4.2 | 100 | 500 | 1,350 | 25 |
| 4 | Silicon carbide | 4.2 | 10 | 500 | 1,350 | 20 |
| 5 | Silicon carbide | 4.2 | 150 | 500 | 950 | 25 |
| Ref. Exp. 1 | Silicon carbide | 4.2 | 100 | 500 | 650 | 6 |
| Ref. Exp. 2 | Silicon carbide | 4.2 | 9 | 500 | 650 | 7 |
| Comp. Exp. | Carbon | 2.6 | — | 500 | — | 5 |

As is seen from Table 6, with the crucible consisting of sole silicon nitride manufactured by the prior art method (comparison crucible) cracks were generated in 5 cycles of sudden heating and sudden cooling. In contrast, with the crucibles No. 1 to No.5 obtained by depositing the silicon thin film and silicon nitride layer and removing the silicon thin film while holding a temperature in a range of 700° to 1,600° C. according to the invention cracks were generated only after 20 cycles of sudden heating and sudden cooling, indicating excellent spalling-resistivity. Also, the purity was very high compared to the crucible obtained by the prior are method even though the purity of the base member was the same. However, with the crucible obtained by effecting the removal of the silicon thin film at a temperature below 700° C. outside the temperature range according to the invention although the series of steps were carried out without any cooling step involved (reference crucible No. 1) cracks were generated in 6 cycles of sudden heating and sudden cooling. With the reference crucible No. 2 consisting of sole silicon nitride with which the silicon thin film was formed to have a very increase of the surface roughness beyond 25μ Hmax, secondary precipitation silicon nitride increases and eventually floats on the melted silicon surface to interfere with the single crystallization of silicon.

It was further found that the surface roughness of the silicon nitride film base on the CVD process 19 related to the speed of deposition of the silicon nitride. Table 8 shows the results of experiments conducted in connection to the relation between the deposition speed and surface roughness.

TABLE 8

| Crucible No. | Deposition speed (μm/hour) | Surface roughness | Precipitation | Single crystal |
|---|---|---|---|---|
| 27 | 0.5 | 7 | Less | Single crystal |
| 28 | 1 | 10 | Less | Single crystal |
| 29 | 10 | 20 | Less | Single crystal |
| 30 | 120 | 200 | Less | Single crystal |
| 31 | 290 | 325 | Slightly great | Single crystal |
| 32 | 350 | 430 | Great | Polycrystalline |
| 33 | 400 | 550 | Very | Polycrystalline |

TABLE 8-continued

| Crucible No. | Deposition speed (μm/hour) | Surface roughness | Precipitation | Single crystal |
|---|---|---|---|---|
| | | | great | |

It is thought that with a high deposition speed and a coarse surface state, the area of the silicon nitride in contact with the melted silicon increases to increase dissolution of reaction product and also the nitrogen concentration in Si. In the cases of the crucibles No. 32 and No. 33, over-saturation with nitrogen is thought to occur, causing secondary precipitation silicon nitride to float on the surface of the melted silicon and trapped into the silicon being pulled up to constitute nuclei of crystal defects, which causes polycrystallization.

EXAMPLE 11

Surface roughness of deposited silicon nitride film obtained by setting various angles of orientation of the opening of a silicon single crystal pull-up device in the deposition of silicon nitride by the CVD process was measured.

More particularly, a crucible base member similar to that in the Example 9 was produced, and deposition was carried out by setting the crucible opening orientation to various angles from the direct downward position (0°), and the surface roughnesses obtained with these angles and their effects were measured. The results are shown in Table 9.

TABLE 9

| Experiment No. | Angle of opening | Abnormal growth | Hmax | Silicon crystal pulled up | Precipitation of $Si_3N_4$ |
|---|---|---|---|---|---|
| 1 | 0 | — | 5 | Single crystal | Less |
| 2 | 10 | — | 5 | Single crystal | Less |
| 3 | 30 | — | 4 | Single crystal | Very less |
| 4 | 50 | — | 6 | Single crystal | Less |
| 5 | 80 | — | 6 | Single crystal | Less |
| 6 | 120 | — | 100 | Single crystal | Less |
| 7 | 130 | — | 300 | Single crystal | Less |
| 8 | 140 | ++ | 429 | Polycrystalline | Great |
| 9 | 150 | +++ | 435 | Polycrystalline | Very great |

When the angle of the opening was 130° or above, coarse silicon nitride surface resulted to increase the reactivity with the melted silicon so as to increase the nitrogen concentration in silicon. In the experiments No. 8 and No. 9, oversaturation resulted. This is thought to be due to precipitation of $\beta$-$Si_3N_4$ on the melted silicon surface and trapping thereof into the crystal being pulled up, thus causing polycrystallization.

EXAMPLE 12

In this Example, experiments were conducted in connection with the relation between the surface roughness of the base member and the surface roughness of the deposition surface of silicon nitride deposited thereon and also effects on the crystallization of silicon single crystal being pulled up. Table 10 shows the results.

In the Table, the crucible type A represents crucibles, in which silicon nitride is deposited on the outer wall surface of the base member such that the deposition surface is in contact with the melted silicon, and the crucible type B represents crucibles, in which silicon nitride was deposited on the inner wall surface of the base member such that the outer deposition surface is in contact with the melted silicon.

TABLE 10

| Experiment No. | Base member | Surface roughness Hmax (μ) of base member | Surface roughness of $Si_3N_4$ | Crucible type | Silicon pulled up |
|---|---|---|---|---|---|
| 1 | Glass-like carbon | 15 | 18 | A | Single crystal |
| 2 | Glass-like carbon | 15 | 190 | B | Single crystal to polycrystalline |
| 3 | Pressed carbon | 35 | 40 | A | Single crystal |
| 4 | Pressed carbon | 35 | 410 | B | Polycrystalline |
| 5 | Pressed carbon | 350 | 400 | A | Single crystal to polycrystalline |
| 6 | Pressed carbon | 350 | 450 | B | Polycrystalline |
| 7 | Silicon | 56 | 65 | A | Single crystal |
| 8 | Silicon | 56 | 520 | B | Polycrystalline |

As is seen from the Table, better results could be obtained with the type A crucibles, in which the surface having been in contact with the base member was made to be contacted with the melted silicon than the crucible type B, in which the exposed or upper surface of the deposited silicon nitride layer was made to be contacted with the melted silicon. In the experiments No. 2 and No. 5, single crystal was obtained in the initial stage of the pull-up, but later polycrystallization resulted. The main reason for the polycrystallization occurring during the source of the pull-up is thought to be due to a large area of contact with the melted silicon of the base member which exudates into the melted silicon and is reacted to result in the dissolution of the reaction product in silicon being pulled up, thus precipitating as $\beta$-$Si_3N_4$ on the surface of melted silicon at low temperature to float and be trapped into the silicon being pulled to so as to constitute nuclei of crystal defects.

What we claim is:

1. In an apparatus for production silicon single crystal by seed pulling from a melt contained in a crucible for molten silicon, the improvement which comprises on at least a portion of the surfaces of said crucible which comes in contact with said silicon melt include a layer comprised of silicon nitride precipitated from a gaseous phase and containing at least 20% of β phase.

2. The apparatus of claim 1, which further comprises a die which extends into contact with the melt and is provided on at least a portion of the surfaces which come in contact with said melt with a layer comprised of silicon nitride percipated from a gaseous phase and containing at least 20% of β phase.

3. In an apparatus for growing silicon single crystal by seed pulling from a silicon melt contained in a crucible for molten silicon, the improvement which comprises on at least a portion of the surfaces of said crucible which comes in contact with said silicon melt include a layer comprising silicon nitride precipitated from gaseous phase and comprising at least 80% of α phase, at least 10% of the crystal grains of said phase having a length of at least 5 microns.

4. The apparatus according to claim 1 or 3, wherein the silicon nitride layer contains as impurities less than 3 ppm of boron, less than 5 ppm of aluminum, less than 10 ppm of iron.

5. The apparatus according to claim 1 or 3, wherein said silicon nitride layer has a smooth surface with the surface roughness being no more than 400μπ in Hmax.

6. The apparatus according to claim 5, wherein the surface roughness is no more than 25 μm in Hmax.

7. The apparatus according to claim 1 or 3 wherein said apparatus further includes a heat-resistive base member having the silicon nitride layer deposited thereon.

8. The apparatus according to claim 7, wherein the base member is made of a material selected from the group consisting of carbon, silicon and silicon carbide.

9. The apparatus according to claim 7, wherein the base member is made of silicon nitride.

10. The apparatus according to claim 7, wherein the base member includes as impurities less than 250 ppm of iron, less than 50 ppm of copper, and has a porosity in the range of 10 to 40%.

11. The apparatus of claim 3, which further comprises a die extending into contact with the melt and which is provided with, on at least a portion of the surfaces in contact with said melt, a layer comprising silicon nitride precipated from gaseous phase and comprising at least 80% of α phase, at least 10% of the crystal grains of said phase having a length of at least 5 microns.

* * * * *